United States Patent [19]

Kusui et al.

[11] 4,217,545
[45] Aug. 12, 1980

[54] ELECTRONIC TYPE POLYPHASE ELECTRIC ENERGY METER

[75] Inventors: Shoji Kusui, Soka; Nobuyasu Yamazaki, Zushi; Yoshio Ikeda, Kanagawa, all of Japan

[73] Assignee: Nihon Denki Keiki Kenteisho, Tokyo, Japan

[21] Appl. No.: 588,938

[22] Filed: Jun. 20, 1975

[51] Int. Cl.[2] .............. G01R 21/06; G01R 11/16
[52] U.S. Cl. ........................... 324/107; 324/111; 324/142
[58] Field of Search ............... 324/107, 108, 111, 142; 235/151.21

[56] References Cited

U.S. PATENT DOCUMENTS

| | | | |
|---|---|---|---|
| 2,302,474 | 11/1942 | Rich | 324/107 |
| 2,615,063 | 10/1952 | Brown | 324/111 |
| 2,998,569 | 8/1961 | Legatti et al. | 324/107 |
| 3,286,178 | 11/1966 | Ultcht | 324/107 |
| 3,794,917 | 2/1974 | Martin et al. | 324/142 |
| 4,092,590 | 5/1978 | Watanabe | 324/107 |

Primary Examiner—Ernest F. Karlsen
Attorney, Agent, or Firm—Ladas & Parry

[57] ABSTRACT

In a polyphase electric energy meter, voltages of the phases of a polyphase alternating power to be measured are utilized to subject an input pulse signal to be applied to a pulse distributor to pulse width modulation to form polyphase control pulses, which cyclically operate switches provided respectively for the phases so that an operation circuit cyclically receives the voltages and currents of the phases and produces a current output proportional to the sum of the electric powers of the phases.

8 Claims, 3 Drawing Figures

ELECTRONIC TYPE POLYPHASE ELECTRIC ENERGY METER

BACKGROUND OF THE INVENTION

This invention relates to electronic type polyphase electric energy meters.

In general, in order to measure an electric power or energy of a polyphase n-wire system, it is necessary to provide n−1 wattmeters or electric power measuring devices according to Blondel's theorem. Therefore, out of the conventional polyphase power measurements, for instance in a three-phase 3-wire power measurement, the two-wattmeter method is employed or an electronic type electric power measuring device having a plurality of operation circuits is employed.

However, polyphase electric power or energy meters according to the conventional art are intricate in construction and operation. Especially, conventional electronic type electric energy meters employed in the conventional art are each composed of a number of component parts and are therefore undesirable with respect to reliability and economy. Furthermore, the characteristics of the measuring elements of the conventional polyphase electric energy meter are not uniform, which causes interphase unbalance errors. Since the interphase unbalance errors must be corrected, the conventional polyphase energy meters have been manufactured by complicated manufacturing processes, and therefore the measurement accuracy thereof is limited.

SUMMARY OF THE INVENTION

Accordingly, an object of this invention is to overcome the above-described difficulties accompanying conventional electronic type polyphase electric energy meters.

More specifically, an object of the invention is to provide an electronic type polyphase electric energy meter which has a relatively simple construction and is suitable for precisely measuring electric energy of a polyphase alternating current circuit.

Another object of the invention is to provide an electronic type polyphase electric energy meter having only one operation circuit for performing all the multiplication operations of voltages and currents of the phases of a polyphase alternating current circuit.

A further object of the invention is to provide an electronic type polyphase electric energy meter which is accurate and reliable in measuring electric energy of a polyphase alternating current circuit.

In order to achieve the foregoing and other objects, an electronic type polyphase electric energy meter according to this invention comprises only one operation circuit for multiplying voltages and currents of the phases of a polyphase circuit, the voltages and currents being sequentially supplied thereto through respective electronic switches provided for the phases. In the operation circuit, polyphase pulse signals are formed to cyclically operate the electronic switches so as to produce an output corresponding to a sum of electric powers of the phases of the polyphase alternating current circuit.

The polyphase electric energy meter according to this invention utilizes the operation of the electronic switches so that only one operation circuit can perform all of the multiplication operations of voltages and currents of the phases, and therefore the number of component parts thereof is much less than that of the conventional polyphase electric energy meter; that is, the former meter is simpler, more economical, more accurate, and more reliable than the latter meter.

Incidentally, a multi-measurement system employed in a measurement, for instance, by a multi-point recording thermometer is known. However, the technical concept of this invention is basically different from that of the multi-measurement system and is intended to obtain combined analog outputs by setting input time widths equal.

The invention will be better understood from the following detailed description taken in connection with the accompanying drawings.

DETAILED DESCRIPTION OF THE INVENTION

Figure 1:
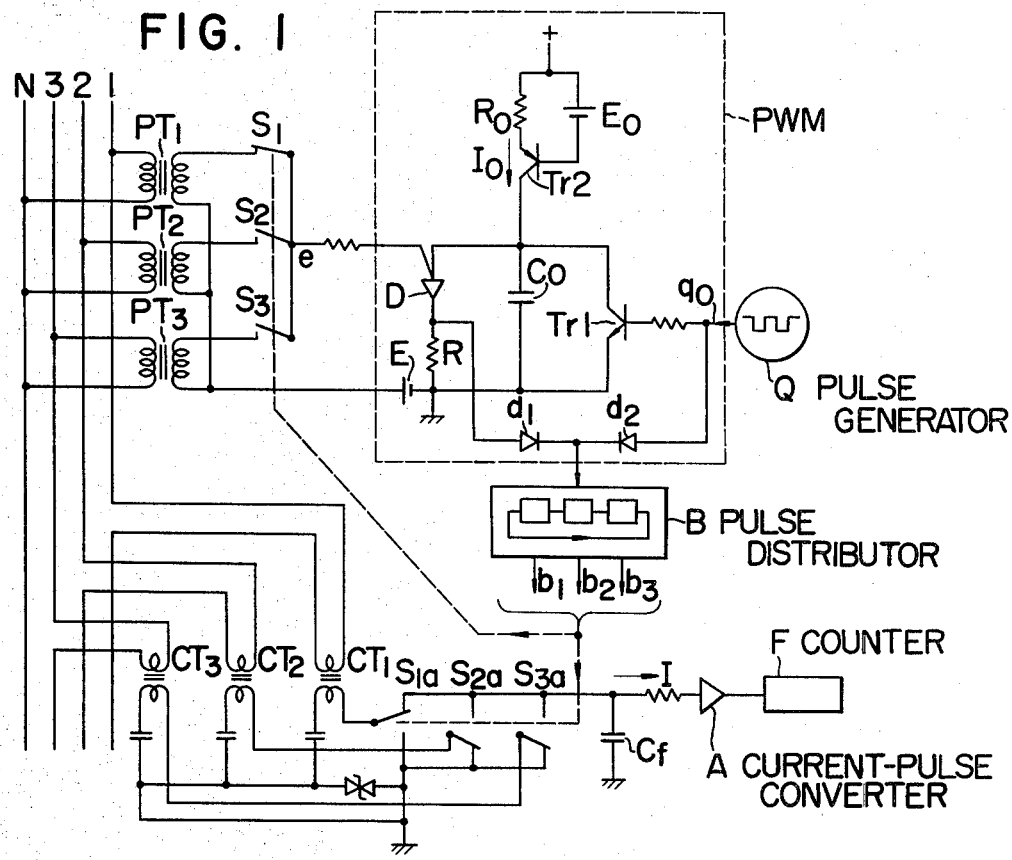
FIG. 1 is a circuit diagram, partly as a block diagram, illustrating a three-phase, four-wire type electric energy meter which is a preferred example of this invention.

The three-phase, four-wire type electric energy meter constituting a preferred example of this invention, as shown in FIG. 1, includes three-phase wires 1, 2 and 3, the neutral wire N, voltage transformers $PT_1$, $PT_2$ and $PT_3$, and current transformers $CT_1$, $CT_2$, and $CT_3$. These voltage and current transformers are provided for detecting voltages and currents of the three phases, respectively, the voltages and currents detected by the transformers are applied cyclically to an operation circuit (described later in detail) through electronic switches $S_1$, $S_2$ and $S_3$ and $S_{1a}$, $S_{2a}$ and $S_{3a}$, such as, for instance, switching transistors, connected respectively to the secondary windings of the voltage transformers and the current transformers.

The operation circuit is so designed as to provide the product of voltage and current of each phase and to produce a current output I proportional to the sum of the electric powers of the three phases. The current output I thus produced is converted into pulses by a current-pulse converter A. The pulses thus obtained are introduced into a counter F and are integrated thereby. The number of pulses counted by the counter F for a predetermined period of time is representative of a value corresponding to the electric energy.

More specifically, the operation circuit is provided with a pulse generator Q generating a pulse signal $q_o$ and a pulse distributor B constituted by, for instance, shift registers for forming polyphase control pulses (three-phase control pulses in this example) with the aid of the pulse signal $q_o$ and distributing the polyphase control pulses to the respective electronic switches. Output currents of the secondary windings of the current transformers are alternately introduced into the operation circuit by the electronic switches $S_{1a}$, $S_{2a}$ and $S_{3a}$ which are operated by the three-phase control pulses, respectively, to obtain an average value of the secondary output currents of the current transformers proportional to the electric power.

A capacitor C is connected to the secondary circuit of each current transformer in order to prevent a direct current from flowing in the secondary circuit, and to operate as a current output source.

The operation circuit further comprise a pulse width modulation circuit PWM, as shown in FIG. 1, which comprises a switching transistor Tr1 controlled by the pulse signal $q_o$ of the pulse generator Q, a capacitor $C_o$ connected between the collector and the emitter of the transistor Tr1, a transistor Tr2 having an emitter resistor $R_o$ and biased by a reference voltage $E_o$ to supply a reference current $I_o$, a trigger diode D connected through its load resistor R in parallel to the capacitor $C_o$, a d.c. source E connected to the common terminal of the secondary windings of the voltage transformers $PT_1$, $PT_2$ and $PT_3$, and a gate circuit consisting of diodes $d_1$ and $d_2$.

During the period of time when the switching transistor Tr1 is maintained nonconductive by the pulse signal $q_o$ of the pulse generator Q, the reference current $I_o$ supplied by the transistor Tr2 charges the capacitor $C_o$, and the voltage of the capacitor $C_o$ increases linearly. When the voltage of the capacitor $C_o$ exceeds a voltage (E+e), the trigger diode D connected in parallel to the capacitor $C_o$ becomes shorted, as a result of which a voltage ($I_o$·R) is developed across the load resistor R of the trigger diode D. This state is continued until the transistor Tr1 is rendered conductive. Accordingly, a zero level pulse width of an input pulse signal which is applied to the pulse distributor B through the gate circuit $d_1$, $d_2$ is equal to a period of time required for charging the capacitor $C_o$; that is, it can be represented by the following equation:

$$\tau = C_o(E+e)/I_o$$

This means that the pulse width $\tau$ is modulated with the input voltage e. The input pulse signal thus modulated is formed into the above-described three-phase pulses $b_1$, $b_2$ and $b_3$ by the pulse distributor B, and the three-phase pulses thus formed are distributed to the respective electronic switches $S_1$, $S_{1a}$; $S_2$, $S_{2a}$; and $S_3$, $S_{3a}$ by the pulse distributor B. The operating frequencies of these electronic switches are selected much higher than the frequency of a three-phase alternating current to be measured.

Figure 2:
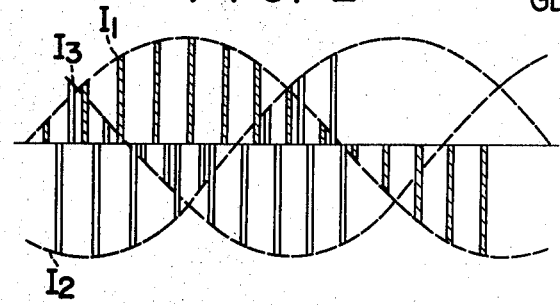
FIG. 2 is a waveform diagram used for describing the operation of the electric energy meter shown in FIG. 1.

Shown in FIG. 2 are output waveforms $I_1$, $I_2$ and $I_3$ obtained respectively by operating the electronic switches $S_1$, $S_{1a}$; $S_2$, $S_{2a}$; and $S_3$, $S_{3a}$. That is, the output waveforms $I_1$, $I_2$ and $I_3$ are operation output waveforms of the first, the second and the third phase component, respectively. The combined operation output I of these outputs $I_1$, $I_2$ and $I_3$ is smoothed into a direct current by a smoothing capacitor Cf, which direct current is proportional to the sum of the electric powers of the three phases. This direct current is converted by the current-pulse converter A into pulses, which are counted by the counter F for a predetermined period of time, and the resultant value is displayed as the electric energy.

In the example shown in FIG. 1, the switches $S_{1a}$, $S_{2a}$ and $S_{3a}$ are current-operated switches, and therefore the influence of their internal resistances is slight. Furthermore, the operation output is a current output, and therefore the influence of a voltage drift caused in the current-pulse converter is also slight.

Figure 3:
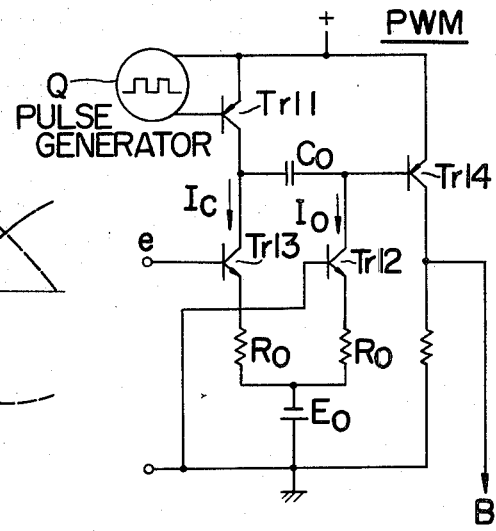
FIG. 3 is a circuit diagram illustrating a modification of a pulse width modulation circuit included in FIG. 1.

A modification of the pulse width modulation circuit is shown in FIG. 3. When a transistor Tr11 in this circuit has been rendered non-conductive by a pulse signal from a pulse generator Q, a current $I_c$ proportional to a voltage ($E_o+e$) charges a capacitor $C_o$ with the aid of an input transistor Tr13 for a certain period of time $T_o$.

Thereafter, the transistor Tr11 is rendered conductive again, whereupon a switching transistor Tr14 is rendered non-conductive, and a constant current $I_o$ obtained by a circuit of a transistor Tr12, a resistor $R_o$ and a reference voltage $E_o$ starts reversely charging (discharging) the capacitor $C_o$. As a result, the base potential of the transistor Tr14 decreases at a rate proportional to the current $I_o$, and finally the transistor Tr14 is rendered conductive again. However, it should be noted that the transistor Tr14 is kept non-conductive for the period of time $\tau$ during which the capacitor $C_o$ is discharged. Since the charging quantity $I_cT_o$ of the capacitor $C_o$ is equal to the discharging quantity $I_o\tau$, the period of time $\tau$ can be expressed by the following equation.

$$\tau = I_cT_o/I_o'(E_o+e)$$

Thus, the period of time $\tau$ is modulated with the input voltage e. Similarly as in the operation of the circuit shown in FIG. 1, the output pulse of the circuit of FIG. 3 is applied to the pulse distributor B.

As is apparent from the above-description, according to the invention, the combination of the pulse width modulation circuit and the electronic switches, and especially the capacitor coupling current transformers contribute to effecting the polyphase power-current conversion and to reducing the number of parts required for the electric energy meter. Furthermore, since the pulse width modulation circuit is commonly used for all of the phases, the interphase balance is maintained well, and accordingly the measurement accuracy of the meter is remarkably improved.

As was described before, the operation output is a current output, and therefore the integration of the output by the capacitor can be readily achieved, which leads to the provision of a high-precision electric energy meter.

While the principles of this invention have been described above in conjunction with specific embodiments thereof, it is to be clearly understood that this description is made only by way of example and not as a limitation on the scope of invention.

What is claimed is:

1. An electronic wattmeter circuit arrangement for providing an output current proportional to the sum of the power of each phase of an energized a.c. polyphase power system, said circuit arrangement comprising:
    (a) a pulse generator for producing rectangular clock pulses at a repetition rate substantially greater than that of the energizing frequency of said power system;
    (b) phase voltage sampling means including a plurality of first electronic switches, each first switch being associated with a respective phase of said polyphase power system and being operable for the duration of a control pulse fed thereto to supply a voltage sample of said duration from its said respective phase to a first common terminal;
    (c) a pulse width modulator connected to said pulse generator for receiving said clock pulses therefrom as a carrier input, said modulator being connected to said first common terminal for receiving the phase voltage samples supplied thereto as a modulating input, whereby the pulse width modulator produces for each clock pulse a modulator output pulse the width of which is modulated according to the voltage value of the phase voltage sample then being supplied to said first common terminal;

(d) phase current sampling means including a plurality of second electronic switches, each second switch being associated with a respective phase of said polyphase power system and being operable for the duration of a control pulse fed thereto to supply a current sample of said duration from its respective phase to a second common terminal;

(e) a pulse distributor connected to said modulator and pulse generator for receiving said modulator output pulses and said clock pulses and, in response thereto, serially supplying a switch-operating control pulse to the corresponding pairs of said first and second switches in synchronism with the clock pulse repetition rate, whereby the operation of one corresponding pair of switches is followed in time sequence by the operation of each of the other corresponding pairs of switches; and (f) means for obtaining the average value of the phase current samples supplied by said second switches to said second common terminal, said average value being the desired output current proportional to the sum of the power of each phase.

2. An electronic wattmeter circuit arrangement according to claim 1, wherein each modulator output pulse is serially supplied as said switch-operating control pulse by said pulse distributor to at least the second switch of each of said corresponding pairs of said first and second switches in synchronism with said clock pulse repetition rate.

3. An electronic wattmeter circuit arrangement according to claim 1, wherein said phase current sampling means further includes a plurality of current transformers, each current transformer having a primary winding in a respective phase of said polyphase power system and a secondary winding in which a capacitor is connected in series with a respective one of said second electronic switches for preventing a flow of any direct current in said secondary winding.

4. An electronic wattmeter circuit arrangement according to claim 1, wherein said phase voltage sampling means further includes a plurality of voltage transformers, each voltage transformer having a primary winding across a respective phase of said polyphase power system and a secondary winding connected in series with a respective one of said first electronic switches.

5. An electronic three-phase four-wire system watt-hour meter comprising:

three voltage transformers and three current transformers which respond, at reduced values, to voltages and currents of each phase of a three-phase four-wire system A.C. load which is to be measured, said transformers including primary and secondary windings;

electronic switches for voltage and current which are connected to the secondary windings for each of the voltage transformers and current transformers and are adapted for being cyclically opened and closed by three-phase control pulse signals;

means to generate the said three-phase control pulse signals in rectangular wave form;

a single operational circuit which is coupled in common to said switches and which multiplies the voltage and current of each phase as received from said electronic switches and produces an output corresponding to the sum of the electric power of the phases in the form of current;

a current-pulse converter circuit which converts the current output of said operational circuit to pulses; and a pulse counter which counts the pulses from the current-pulse converter and displays the electric energy of the three-phase A.C. system, said operational circuit comprising pulse distributor means, trigger means, first and second reference power sources, a capacitor, first and second transistors, a pulse generator and first and second diodes, said pulse generator generating a pulse signal having high and low levels and a frequency substantially greater than that of the three-phase system to be measured, said first transistor being coupled to said pulse generator and across said capacitor and shorting the latter when the pulse signal is at the high level, said first diode being coupled between said trigger means and said pulse distributor means, said second diode being coupled between said pulse generator and said pulse distributor means and passing positive pulses to the latter, said pulse distributor means upon receipt of a positive pulse from said second diode terminating generation of pulses and opening said electronic switches thereby shorting the secondaries of the current transformers, said first transistor responding to the low level of the pulse signal to permit said capacitor to be charged via said second transistor from said first power source, said trigger means being fired when the voltage of said capacitor reaches a value related to that of said second power source and the secondary of the voltage transformer whereupon said distributor means commences a sequential operation of said switches.

6. An electronic three-phase four-wire system watt-hour meter as claimed in claim 5, comprising an RC circuit coupling the switches, which are coupled to said current transformers, to said converter circuit.

7. An electronic three-phase four-wire system watt-hour meter as claimed in claim 5, wherein said trigger means includes a trigger diode.

8. An electronic three-phase four-wire system watt-hour meter as claimed in claim 5, wherein said trigger means includes a transistor circuit.

* * * * *